United States Patent [19]
Oh et al.

[11] Patent Number: 5,298,899
[45] Date of Patent: Mar. 29, 1994

[54] PCM ENCODER AND DECODER USING EXKREMA

[75] Inventors: Kwang-Sok Oh, Seoul; Geun-Rae Cho, Buchon; Jae-Bum Hong, Seoul, all of Rep. of Korea

[73] Assignee: SamSung Electronics Co., Ltd., Suwon, Rep. of Korea

[21] Appl. No.: 899,856

[22] Filed: Jun. 17, 1992

[30] Foreign Application Priority Data

Dec. 27, 1991 [KR] Rep. of Korea .............. 91-24602

[51] Int. Cl.⁵ .................. H03M 1/00; H03M 3/00
[52] U.S. Cl. ................................. 341/132; 341/143; 341/76
[58] Field of Search .............. 375/27; 341/132, 143, 341/155, 76, 77

[56] References Cited

U.S. PATENT DOCUMENTS

| | | | |
|---|---|---|---|
| 4,142,066 | 2/1979 | Ahamed | 341/143 |
| 4,583,237 | 4/1986 | Haskell | 375/27 |
| 4,807,250 | 2/1989 | Tanaka | 341/143 |
| 4,852,129 | 7/1989 | Schwartz | 375/27 X |
| 5,084,904 | 1/1992 | Daito | 341/143 X |
| 5,231,397 | 7/1993 | Ridkosil | 341/132 X |

Primary Examiner—Howard L. Williams
Attorney, Agent, or Firm—Robert E. Bushnell

[57] ABSTRACT

A separator provides peak value data and distance value data, a pair of registers respectively store multiple peak values and distance value data between peak values, a subsequent stage subtracts the series of multiple successive peak values to provide difference data, and divides the difference data by the distance value data to provide quotient data representative of a step size, and an interpolator provides a reproduced waveform by interpolating the peak value data and the quotient data.

22 Claims, 4 Drawing Sheets

PCM ENCODER AND DECODER USING EXKREMA

TECHNICAL BACKGROUND

The present invention concerns an apparatus for encoding/decoding an analog signal and method thereof, wherein an analog signal such as an audio and video signal is compressed to reduce the transferred data stored in a memory.

The Pulse Code Modulation (PCM) which, is typically known as a method of encoding a waveform, employs a communications system comprising a sampler, an analog-to-digital(A/D) converter of a transmitter and a digital-to-analog(A/D) converter of a receiver. The A/D converter comprises a quantizer and an encoder, while the D/A converter comprises a quantizer and a decoder. In such PCM communications system, a waveform is modulated as follows:

An input analog signal is firstly sampled by the sampler, and the sampled portions are quantized. Namely, the signal of a limited frequency band which has no frequency components exceeding the maximum frequency fm(Hz) is sampled at the sampling interval T(Nyquist sampling interval ½ fm sec).

The sampled signal is divided into several steps quantized to a constant value at the center of each step. The quantized signal at each step has a quantized level approximating the original signal. Thus the pulses are quantized according to their sizes encoded by the encoder into the effective combination of the pulses for each sample.

The signal which is encoded into digital is separated from the noise added in the transference, and detected by the quantizer for the existence of the pulses in each pulse interval, where two voltage level differences are compared so as to transfer the result as a series of the reproduced pulses to the decoder. In contrast to the encoder, the D/A converter of the decoder produces the quantized sample pulses array of multiple levels, which is filtered to remove the frequency components except the base band providing a reproduced waveform as shown in FIG. 1.

Such PCM communication system requires a plurality of pulses for transmitting a sampled signal and thus a greater amount of data than the other pulse modulation systems in transmitting the same data. This system most approximately reproduces the original signal, but requires the data according to the number of the bits to quantize the value of each sampling, thus increasing the amount of data. Namely, 64 Kbits per second are needed in order to quantize a speech signal in 8 bits by sampling at every 8 KHz.

In view of the above fact, there has been proposed an adaptive delta Modulation (ADM) in order to reduce the amount of the data within the range not to considerably distort the original signal. This modulation system adaptively varies the step size of the reproduced waveform according to the variation of the original waveform, so that the required amount of the step size is added or subtracted in order to reconstruct the original signal waveform from the signal waveform obtained by ADM. Namely, the step size is increased by the base step size when the step direction of "k" th clock waveform edge (where the waveform changes to "high" or "low") is the same as in the edge(k−1), reduced by the basic stepsize when the step direction is opposite, and maintains the base step in the direction of approximating the original signal, as shown in FIG. 2.

This ADM system makes it possible to compress the data by 1 bit quantization with sufficiently short sampling period because the samplings are very closely interrelated. Hence, there is needed 1 bit per 1 sample, so that 32 k samplings require 32 k bits per second, thereby reducing the amount of the data to a half of that required for the PCM system.

However, this system is not accommodated to the abrupt changes of the original signal so as to produce the slope-over load distortion and granular noise which causes the reproduced waveform to repeat 0,1,0,1 even in a slight change of the original signal, thus making it difficult to reproduce the original signal waveform.

SUMMARY OF THE INVENTION

It is an object of the present invention to provide an apparatus and method for encoding/decoding a waveform, whereby the original signal waveform may be adequately reproduced as well as reducing the amount of the data.

It is another object of the present invention to provide an apparatus and method for encoding/decoding a waveform, whereby the capacity of the data storage memory is reduced and may transmit a greater amount of the data through a communication channel.

According to one aspect of the present invention, an apparatus for encoding/decoding a waveform, comprises a first filter for removing the frequency components exceeding the maximum frequency from a waveform, an analog/digital converter (A/D converter) for converting the band-limited analog signal of the first filter into a digital signal so as to produce a pulse code modulation (PCM) data, a detector for substituting the data portion below a given level of the PCM data produced from the A/D converter with zero(0), a buffer for receiving as a sample a series of multiple PCM data, a comparator for comparing the magnitudes of a series of multiple data produced from the buffer so as to select the peak value produced, a counter reset by the peak value for counting every PCM sample until detecting the next peak value, a multiplexer for multiplexing the outputs of the comparator and counter to sequentially generate the peak value data and counted value(distance data), a separation circuit for separating the peak value data and distance data, a first register for storing a series of the multiple peak value data, a second register for storing the distance data between the peak values, a first operation means for performing subtracting operation between the series of multiple peak values data, a second operation means for dividing the peak values by the distance data, an interpolator for interpolating reproduced data by receiving the peak values data of the first register, the quotient data of the second operation means and the remainder data of the first operation means, a D/A converter for converting the output data of the interpolator into a analog signal, and a second filter for smoothing the output signal of the D/A converter.

According to another aspect of the present invention, a method for encoding/decoding, comprises the steps of sampling an input analog signal at the minimum sampling rate, quantizing the sampled data at a given level to encode it, comparing the magnitudes of every three successive encoded sampled data to obtain the peak value(p(k)), dividing the difference signal (App(k)) between two successive peak values (p(k) and p(k−1)) by the distance(number of samples, d(k)) between the two peak values so as to determine a step size(st(k)), and obtaining a reproduced waveform by calculating the equation p(k−1)+[d(k)·st(k)] of the peak value data(p(k)), distance data(d(k)) and step size data (st(k)).

The present invention will now be described with reference to the drawings attached only by way of example.

BRIEF DESCRIPTION OF THE ATTACHED DRAWINGS

DETAILED DESCRIPTION OF A CERTAIN PREFERRED EMBODIMENT

Figure 1:
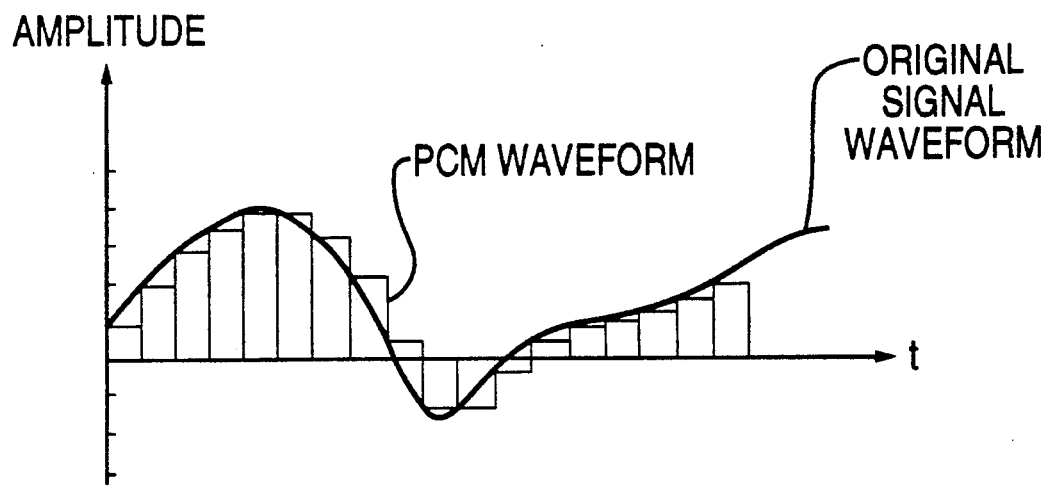
FIG. 1 illustrates a signal waveform reproduced by the conventional PCM system.
Figure 2:
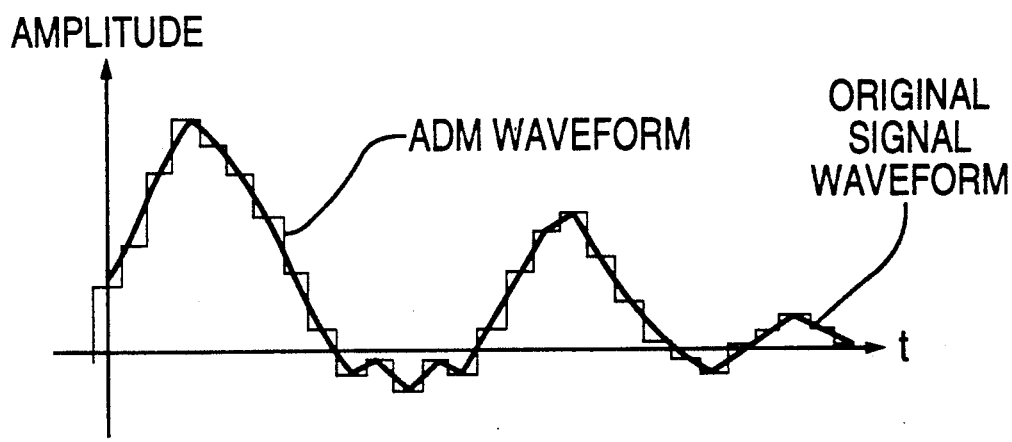
FIG. 2 illustrates a signal waveform reproduced by the conventional ADM system.
Figure 3:
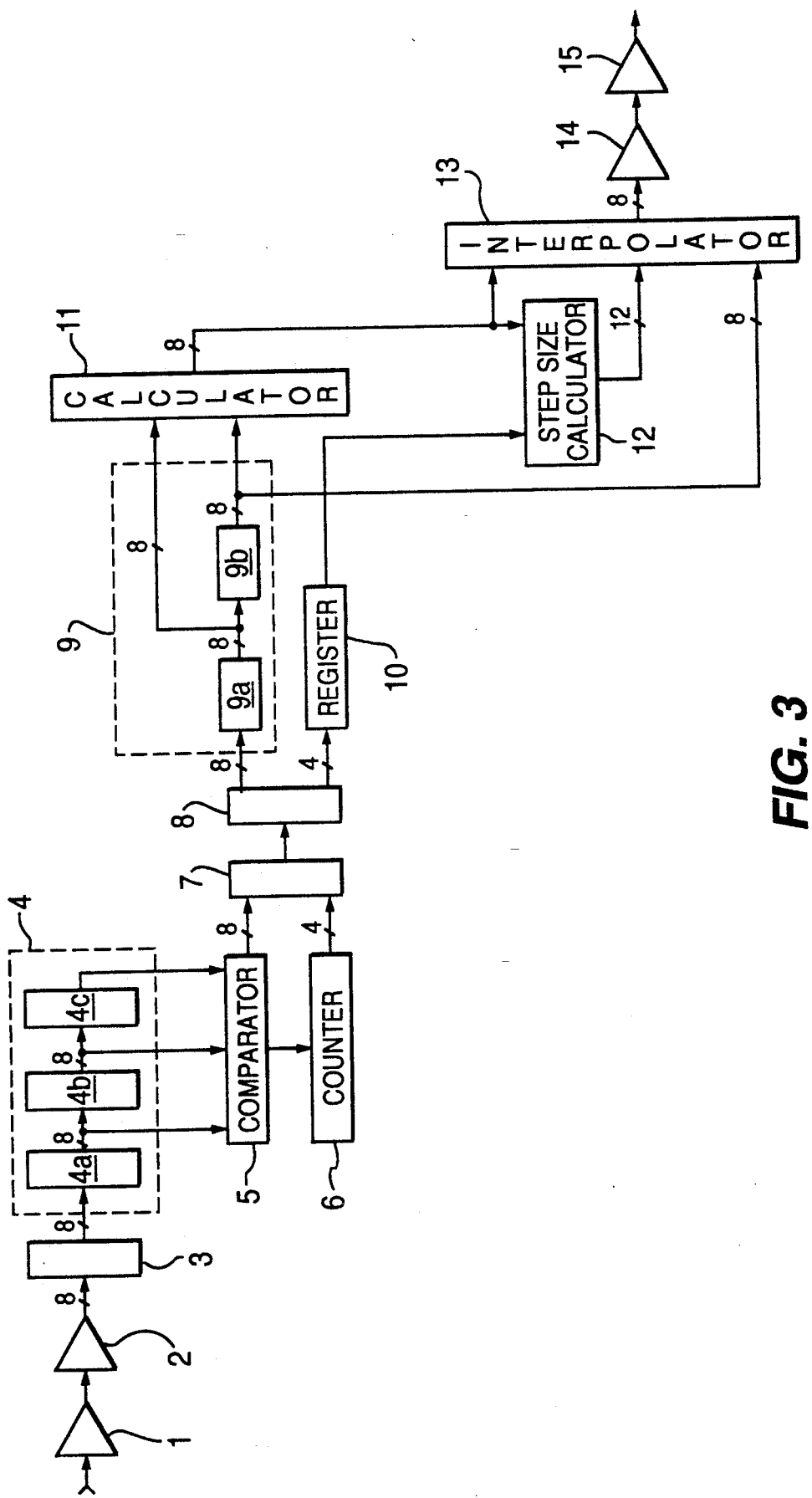
FIG. 3 is a block diagram for illustrating an apparatus for encoding/decoding a signal waveform according to the present invention.
Figure 4:
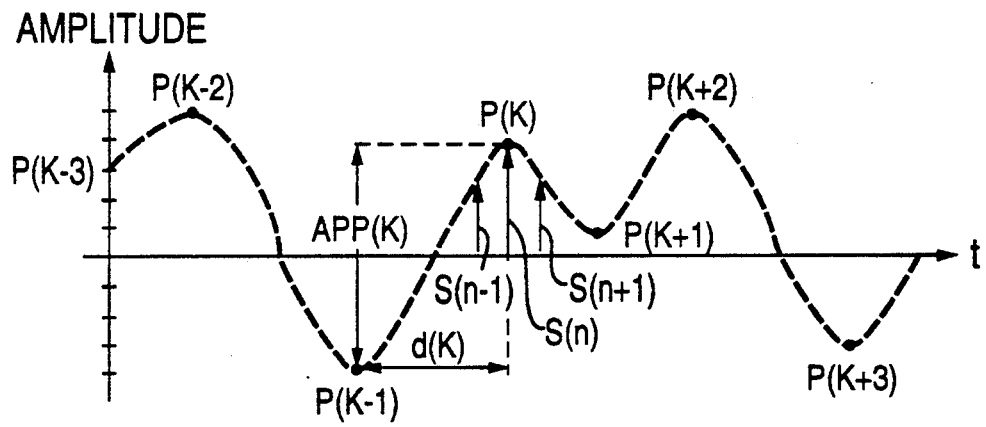
FIG. 4 shows a waveform for illustrating the procedure of a method for encoding/decoding a signal waveform according to the present invention.

As shown in FIG. 3, an apparatus for encoding/decoding a signal waveform comprises a band-pass filter (BPF) 1 for removing the frequency components exceeding a maximum frequency $f_{max}$, an A/D converter 2 for quantizing a sampled signal, a zero-quantizer 3 for substituting the signals below a given level with 0, a PCM data buffer 4 for storing and buffering PCM data, a comparator 5 for comparing the magnitude of the PCM data, a counter 6 for counting the distance between the peak values, a multiplexer 7 for multiplexing the peak values and the output value of the counter, a demultiplexer 8 for separating the peak value data and distance data, a first register 9 for storing two successive peak value data, a four bit second register 10 for storing the distance data, a calculator 11 for producing the difference between the two successive peak value data, a step size calculator 12, an interpolator 13, a D/A converter 14, and a smoothing filter 15 for smoothing the reproduced signal waveform.

The input analog signal is filtered of the frequency components exceeding the maximum frequency $f_{max}$ through the BPF 1 based on Nyquist's theorem, and then sampled at a sampling interval of Nyquist's ½ fm seconds. The A/D converter 2 divides the sampled signal into several steps according to the size of the pulses so as to quantize it in each step size. The quantized pulses are encoded in binary system so as to generate the data in the complementary number of 2. In this case, the quantized PCM values below a given level are substituted with 0 by the zero quantizer so as to eliminate the noise together with faint signals, thus reducing the amount of the PCM data.

Three successive sampled data s(n−1), s(n) and s(n+1) of the A/D converter 2 are transferred to the PCM data buffer 4 serving as a shift register, respectively stored in 4a, 4b and 4c to produce toward the comparator 5.

The comparator 5 compares the magnitude of the three successive data so as to produce the value of s(n) when either of the following Eqs. (1) and (2) are satisfied.

$$s(n-1) < s(n) > s(n+1) \quad (1)$$

$$s(n-1) > s(n) < s(n+1) \quad (2)$$

Where s(n, n−1, n+1) respectively represent the "n"th, "n−1"th, "n+1"th PCM sampled values, the produced sampled value s(n) the maximum and minimum peak values PU(k) and PL(k), and k an arbitrary value.

Detecting the peak values of the comparator 5, the counter 6 is reset to count every PCM sample until detecting the next peak value. The counted value is a distance data representing the number of the samples between the peak values transferred to the multiplexer 7 which multiplexes the peak value data p(k) of the compacator 5 and the distance data d(k) of the counter 6 transferring the output to the transmission channel or storage memory in the order of p(0), d(1), p(1), d(2), p(2), d(3) . . . .

The peak value data p(k) and distance data d(k) are separated by the demultiplexer 8 stored in the first register 9, wherein two successive peak value data p(k−1) and p(k) are respectively stored in the registers 9b and 9a, and the distance data in the four bit second register 10.

The first register 9 delivers two successive 8 bit peak value data p(k−1) and p(k) to the calculator 11 to perform subtraction operation as the following Eq. (3).

$$App(k) = p(k) - p(k-1) \quad (3)$$

Consequently there is produced the difference signal data App(k) of 8 bits.

The step size calculator 12 divides the difference signal data App(k) by the distance data d(k) produced by the second register 10 as the following Eq. (4).

$$st(k) = \frac{App(k)}{d(k)} \quad (4)$$

The resultant value st(k) is treated to have the quotient of 8 bits and the remainder of 4 bits in order to improve the quality of the data reproduced by the interpolator 13. Thus the step size calculator 12 determines the step size, and the resultant value st(k) has a negative or positive value according to whether the difference signal App(k) is negative or positive.

This value is used by the interpolator 13 to generate the reproduced data 1NP(k) as shown by the following Eq. (5):

$$1NP = P(k-1) + [d(k) \cdot st(k)] \quad (5)$$

Figure 5:
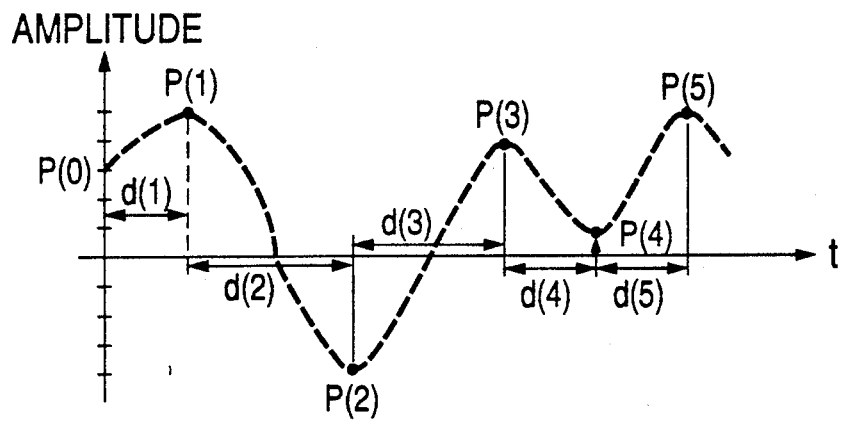
FIG. 5 shows a waveform for illustrating an embodiment of the present invention.

Describing this procedure more specifically, when the peak value data p(k) is p(0), p(1), p(2), p(3), p(4), p(5) . . . , and the distance data d(k) is d(1), d(2), d(3), d(4), d(5) . . . , as shown in FIG. 5, the difference signal App(k) and step size data st(k) are expressed as follows:

Difference signal App(k) is $$p(1) - p(0) = App(1)$$

$$p(2)-p(1)=App(2)$$

$$p(3)-p(2)=App(3)$$

$$p(4)-p(3)=App(4)$$

Step size data st(k) is $$App(1)\ Sd(1) = st(1)$$
$$App(2)\ Sd(2) = st(2)$$
$$App(3)\ Sd(3) = st(3)$$
$$\vdots$$

Figure 6:
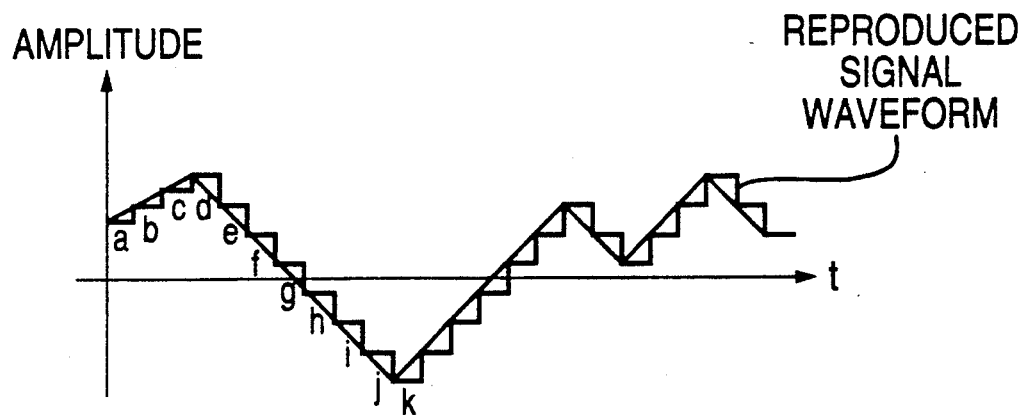
FIG. 6 shows the signal waveform reproduced by an embodiment of the present invention.

Accordingly the reproduced signal waveform INP(k), as shown in FIG. 6, is expressed as follows:

$$a=INP(1.1)=p(0)$$

$$b=INP(1.2)=INP(1.1)+st(1)$$

$$c=INP(1.3)=INP(1.2)+st(1)$$

$$d=INP(2.1)=p(1)$$

$$e=INP(2.2)=INP(2.1)+st(2)$$

$$f=INP(2.3)=INP(2.2)+st(2)$$

$$g=INP(2.4)=INP(2.3)+st(2)$$

$$h=INP(2.5)=INP(2.4)+st(2)$$

$$i=INP(2.6)=INP(2.5)+st(2)$$

$$j=INP(2.7)=INP(2.6)+st(2)$$

$$k=INP(3.1)=p(2)$$

This is performed by the amount of the distance data for each value, which is the result of linear interpolation for connecting p(k) and p(k−1). After the interpolation, there are obtained the 8 bit integer part and the 4 bit fraction part, in which case the integer part 8 bits are only considered in order to convert the digital signal into an analog signal.

The 8 bit interpolated data produced by the interpolator 13 is converted by the D/A converter 14 into an analog signal filtered through the smoothing filter. Thus there is obtained the reproduced waveform approximating the original signal. Although the present embodiment assumes the original signal to have linear waveform, practically encountered signal mostly has non-linear waveform, and therefore in order to obtain more preferable approximation is functionally varied the step size so as to interpolate non-linear waveforms.

Figure 7:
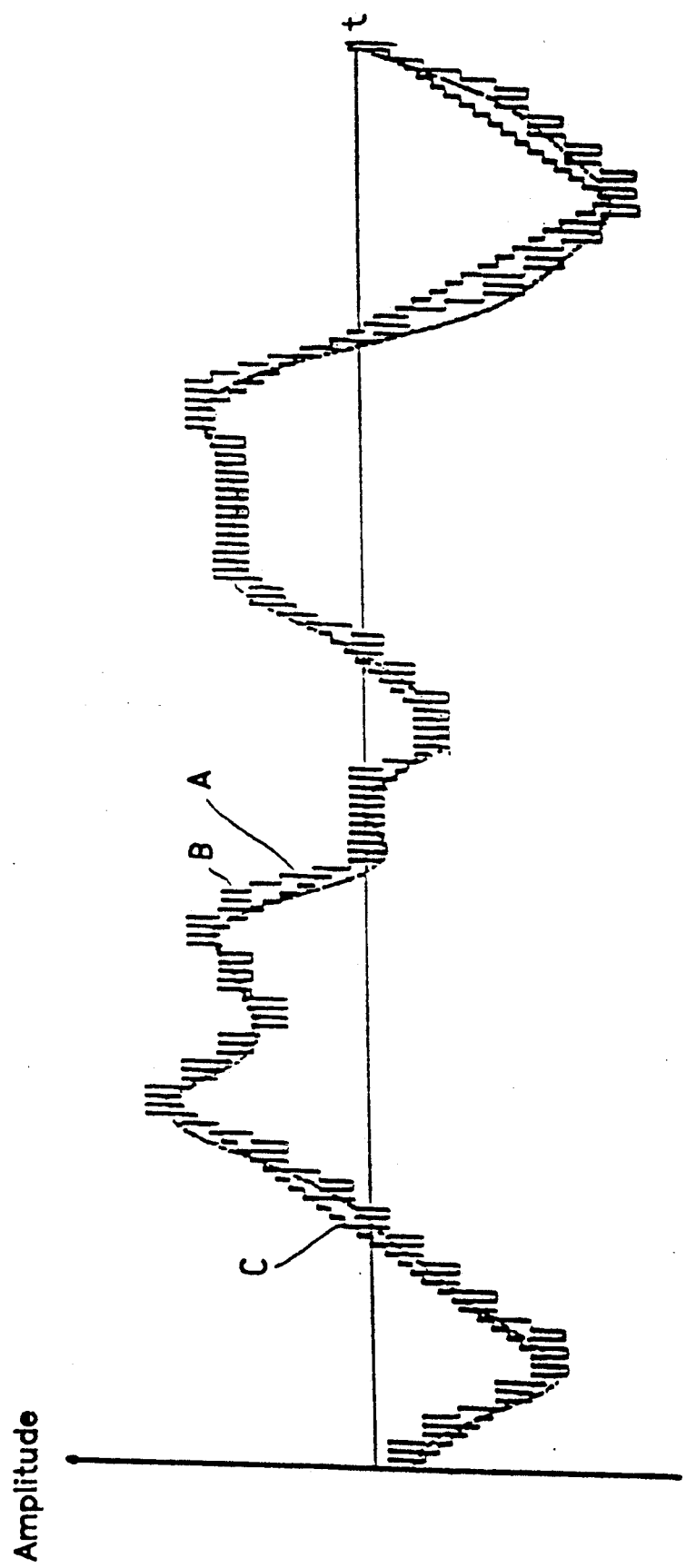
FIG. 7 shows three waveforms each simulating the original signal waveform (A), the signal waveform reproduced by the ADM system and the signal waveform reproduced by the inventive system.

Referring to FIG. 7, the signal waveform C reproduced by the inventive circuit more closely approximates the original signal waveform A than the signal waveform reproduced by the ADM. Moreover the inventive circuit takes only the important sampled data compared to the PCM system taking all of the sampled data, thus reducing the amount of the data as well as preventing the slope-over load error and granular noise distortion inherent in the ADM system.

Concerning the amount of the data, while the ADM system reduces it to a half compared to the PCM system, the inventive circuit may reduce to average one fifth for a speech signal and one thirteenth for an audio signal. Furthermore, the amount of the digitalized signal data is relatively small so that the hardware is even more simplified and the transmission capability of the communications channel is considerably enhanced.

Although the present invention has been described with reference to a certain preferred embodiment, it will be readily appreciated by one skilled in this technical field that further embodiments and various modifications thereof may obtained without departing the spirit of the invention.

What is claimed is:

1. A method for encoding/decoding, comprising the steps of:
   sampling an input analog signal at a minimum sampling rate to provide sampled data;
   quantizing the sampled data at a given level to provide encoded sampled data;
   comparing magnitudes of every three successive encoded sampled data to obtain a peak value (p(k));
   dividing a difference signal (App(k)) between two successive peak values (p(k) and (p(k−1) by a distance (number of samples; d(k)) between the two peak values so as to determine a step size (st(k)); and
   obtaining a reproduced waveform by calculating the equation p(k−1)+[d(k)·st(k)] of the peak value (p(k)), the distance (d(k)) and the step size (st(k)).

2. An apparatus for encoding/decoding a waveform, comprising:
   first filter means for filtering the waveform to provide a filtered signal;
   first converter means for converting the filtered signal into pulse code modulation data;
   detector means for substituting a data portion below a given level of the pulse code modulation data produced from said first converter means with zero;
   buffer means for receiving, as a sample, a series of multiple pulse code modulation data;
   comparator means for comparing magnitudes of the series of multiple pulse code modulation data produced from said buffer means so as to detect peak values;
   counter means, reset by said peak values, for counting every pulse code modulation sample between the peak values to provide distance values;
   multiplexer means for multiplexing between the outputs of said comparator means and said counter means to sequentially generate peak value data and distance value data representing the number of pulse code modulation samples between the peak values;
   separation means for separating said peak value data and said distance value data;
   first register means for storing a series of said multiple peak value data;
   second register means for storing said distance value data between said peak values;
   first operation means for performing a subtracting operation between said series of multiple peak values;
   second operation means for dividing a difference between said peak values by said distance value data;
   interpolator means for producing a reproduced waveform by interpolating the peak value data of said first register means, quotient data of said second operation means, and remainder data of said first operation means;

second converter means for converting the output of said interpolator means into an analog signal; and second filter means for smoothing the analog signal of said second converter means.

3. The apparatus for encoding/decoding a waveform as claimed in claim 2, wherein said buffer means comprises three registers, for storing three successive samples of the pulse code modulation data to enable said comparator means to detect the peak values from the three successive samples of the pulse code modulation data.

4. The apparatus for encoding/decoding a waveform as claimed in claim 2, wherein said first filter means is a bandpass filter for removing frequency components of the waveform exceeding a maximum frequency.

5. The apparatus for encoding/decoding a waveform as claimed in claim 2, wherein said second operation means is a step size calculator for determining a step size of the sample of the pulse code modulation data by dividing the difference of two successive peak values by the distance value data.

6. The apparatus for encoding/decoding a waveform as claimed in claim 5, wherein said interpolator means produces said reproduced waveform by adding a first of the two successive peak values to a product of the distance value data and the step size.

7. An apparatus for encoding and decoding a waveform, comprising:

means for receiving said waveform;

means for quantizing the waveform, and for substituting quantized steps below a given level with zero to provide a quantized signal;

buffer means for storing the quantized signal in a series of multiple samples;

compartor means for detecting peak values of the quantized signal by comparing magnitudes of the series of multiple samples;

counter means responsive to the peak values, for determining distance values between successive peak values by counting a number of samples between each set of two successive peak values;

multiplexer means for multiplexing the outputs of said comparator means and said counter means to sequentially generate peak value data and distance value data;

demultiplexer means for separating the peak value data and the distance value data;

means for separately storing the peak value data in a series of said multiple successive peak values, and the distance value data;

operation means for subtracting between said series of multiple successive peak values to provide a difference data, and for dividing said difference data by said distance value data to provide a quotient data representative of a step size; and interpolator means for producing a reproduced waveform by interpolating the peak value data and said quotient data.

8. The apparatus for encoding/decoding a waveform as claimed in claim 7, wherein said buffer means comprises three registers, for storing three successive samples of the quantized signal to enable said comparator means to detect the peak values from the three successive samples of the quantized signal.

9. The apparatus for encoding/decoding a waveform as claimed in claim 7, further comprised of a bandpass filter for removing frequency components of the waveform exceeding a maximum frequency prior to quantization.

10. The apparatus for encoding/decoding a waveform as claimed in claim 7, wherein said operation means comprises a first calculator for providing said difference data, and a second calculator for determining a step size of the samples of the quantized signal by dividing the difference of two successive peak values by the distance value data.

11. The apparatus for encoding/decoding a waveform as claimed in claim 10, wherein said interpolator means produces said reproduced waveform by adding a first of the two successive peak values to a product of the distance value data and the step size.

12. A method for encoding and decoding a waveform, comprising the steps of:

quantizing the waveform, and substituting quantized steps below a given level with zero to provide a quantized signal;

storing the quantized signal in a series of multiple samples;

detecting peak values of the quantized signal by comparing magnitudes of the series of multiple samples;

determining distance values between the successive peak values by counting a number of samples between each set of two successive peak values;

multiplexing between the peak values and the distance values to sequentially generate peak value data and distance value data;

separating the peak value data and the distance value data;

separately storing the peak value data in a series of said multiple successive peak values, and the distance value data;

subtracting between two successive peak values to provide a difference value;

dividing said difference value by said distance value data to provide a quotient value representative of a step size; and producing a reproduced waveform by interpolating the peak value data and the quotient value.

13. The method for encoding and decoding a waveform as claimed in claim 12, wherein the storing of the quantized signal step stores three successive samples of the quantized signal to enable a detection of the peak values from said three successive samples of the quantized signal.

14. The method for encoding and decoding a waveform as claimed in claim 12, further comprised of filtering steps for removing frequency components of the waveform exceeding a maximum frequency prior to the quantizing step.

15. The method for encoding and decoding a waveform as claimed in claim 14, wherein the reproduced waveform step adds a first of the two successive peak values to a product of the distance value data and the step size to provide said reproduced waveform.

16. An apparatus for encoding and decoding a waveform, comprising:

means for quantizing the waveform, and for substituting quantized steps below a given level with zero to provide a quantized signal in a series of multiple samples;

means for making a first determination of peak values of the quantized signal by comparing magnitudes of the series of multiple samples, and for making a second determination of distance values between successive peak values by counting a number of samples between each set of two successive peak values;

means for sequentially providing peak value data and distance value data in dependence upon said first and second determinations;

means for separately storing the peak value data in a series of said multiple successive peak values, and the distance value data;

operation means for subtracting between said series of multiple successive peak values to provide a difference data representative of a difference between two successive peak values, and for dividing said difference data by said distance value data to provide a quotient data representative of a step size; and means for producing a reproduced waveform by interpolating the peak value data and said quotient data.

17. The apparatus as claimed in claim 16, further comprised of filter means for removing frequency components of the waveform exceeding a maximum frequency prior to the quantization of said waveform.

18. The apparatus as claimed in claim 16, wherein said interpolating means produces the reproduced waveform by adding a first of the two successive peak values to a product of the distance value data and the step size.

19. The apparatus as claimed in claim 16, wherein said operation means comprises:

first calculator means for subtracting between said series of multiple peak values to provide said difference data; and second calculator means for determining the step size of the samples of the quantized signal by dividing said difference data by the distance value data to provide said quotient data.

20. The apparatus as claimed in claim 16, further comprised of a smoothing circuit for smoothing the reproduced waveform.

21. A method for encoding and decoding a waveform, comprising the steps of:

sampling the waveform at a sampling rate to provide sampled data;

quantizing the sampled data at a given level and substituting the sampled data below said given level with a predetermined value to provide encoded data;

comparing magnitudes of every three successive pulses of said encoded data to obtain a peak value;

dividing a difference between two successive peak values by a distance between the two successive peak values so as to determine a step size; and obtaining a reproduced waveform in dependence upon a first one of the two successive peak values, a value representative of the distance between two successive peak values, and the step size.

22. The method for encoding and decoding a waveform as claimed in claim 21, wherein said reproduced waveform is obtained by adding said first one of the two successive peak values to a product of the value representative of the distance and the step size.

* * * * *

UNITED STATES PATENT AND TRADEMARK OFFICE
CERTIFICATE OF CORRECTION

PATENT NO. : 5,298,899
DATED : March 29, 1994
INVENTOR(S) : Kwang-Sok Oh; et al.

It is certified that error appears in the above-indentified patent and that said Letters Patent is hereby corrected as shown below:

ON THE TITLE PAGE

Title, [54], Change "EXKREMA" to --EXTREMA-- .

Column 1, Line 11, After "which", Delete comma ",", Insert comma --,-- before "which" .

Column 6, Line 22, Change "(p(k-1)" to --(p(k-1))-- ;

Column 7, Line 39, Change "compartor" to --comparator-- .

Signed and Sealed this

Fourth Day of October, 1994

Attest:

BRUCE LEHMAN

*Attesting Officer*   *Commissioner of Patents and Trademarks*